(12) United States Patent
Johnson

(10) Patent No.: US 7,365,574 B2
(45) Date of Patent: *Apr. 29, 2008

(54) GENERAL PURPOSE DELAY LOGIC

(75) Inventor: Tyler James Johnson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 295 days.

This patent is subject to a terminal disclaimer.

(21) Appl. No.: 11/207,635

(22) Filed: Aug. 19, 2005

(65) Prior Publication Data
US 2005/0278675 A1    Dec. 15, 2005

Related U.S. Application Data

(63) Continuation of application No. 10/453,129, filed on Jun. 3, 2003, now Pat. No. 6,949,956.

(51) Int. Cl.
*H03K 19/00* (2006.01)

(52) U.S. Cl. .............................. 326/93; 326/99; 326/113
(58) Field of Classification Search ................ 326/93, 326/99, 113; 327/276–277, 284
See application file for complete search history.

(56) References Cited

U.S. PATENT DOCUMENTS 6,539,034 B1 * 3/2003 Shimosaka .................. 370/535

* cited by examiner

Primary Examiner—Anh Q. Tran

(57) ABSTRACT

A logic circuit for delaying a signal input thereto by a number of clock cycles X is described. In one embodiment, the logic circuit comprises a demultiplexer ("DEMUX") which includes an input for receiving the signal and N outputs; a register array comprising at least X registers, wherein each of the N outputs of the DEMUX is connected to a corresponding one of the X registers; and a multiplexer ("MUX") comprising M inputs, wherein each of the M inputs is connected to one of the registers.

18 Claims, 4 Drawing Sheets

GENERAL PURPOSE DELAY LOGIC

CLAIM OF PRIORITY UNDER 35 U.S.C. §120 & 37 C.F.R. §1.78

This nonprovisional application is a continuation application claiming the benefit of the following prior United States patent application entitled: GENERAL PURPOSE DELAY LOGIC, application Ser. No. 10/453,129, filed Jun. 3, 2003 now U.S. Pat. No. 6,949,956, in the name(s) of: Tyler James Johnson, which is hereby incorporated by reference.

CROSS-REFERENCE TO RELATED APPLICATIONS

This application is related to U.S. patent application Ser. No. 10/402,092, filed Mar. 28, 2003, entitled A BUS INTERFACE MODULE; U.S. patent application Ser. No. 10/402,628, filed Mar. 28, 2003, entitled SYSTEM AND METHOD FOR USING A DEBUG BUS AS A CAPTURE BUFFER; U.S. patent application Ser. No. 10/402,122, filed Mar. 28, 2003, entitled SYSTEM AND METHOD FOR VERIFYING HDL EVENTS and U.S. patent application Ser. No. 10/402,034, filed Mar. 28, 2003, entitled AN INTEGRATED CIRCUIT; U.S. patent application Ser. No. 10/453,103, filed Jun. 3, 2003, entitled POST-SILICON TEST COVERAGE VERIFICATION; and U.S. patent application Ser. No. 10/453,720, filed Jun. 3, 2003, entitled SYSTEM AND METHOD FOR PARSING HDL EVENTS FOR OBSERVABILITY, all of which are hereby incorporated by reference in their entirety.

BACKGROUND

The increasing complexity of system designs, increased investment required due to this complexity, and shortened product cycles have presented significant challenges to post-silicon design verification of chipsets. This is especially true with respect to high-end cache coherent non-uniform memory access ("ccNUMA") chipsets where systems can be extremely large and complex. Processor post-silicon verification is typically focused on electrical verification at least as much as functional verification due to the large amount of full custom design. Chipsets present a different challenge due to the large number of cells of which they are comprised. Additionally, due to the sheer number of buses, internal bus arbitration, cache coherency control, queue arbitration, etc., in a large ccNUMA server, post-silicon functional verification of such a chipset consumes a greater amount of resources with respect to electrical verification than processors typically consume. Internal observability, while relatively simple in pre-silicon verification, poses a major obstacle to debug and functional test coverage.

Determining when system verification is complete is a second major obstacle to completing post-silicon verification in a time-effective manner. While pre-silicon simulation-based testing depends significantly on labor intensive directed and pseudo-random testing, post-silicon testing has historically depended on observing system operations that imply correct behavior.

Performing post-silicon design verification is an industry standard practice that facilitates exposure of bugs not typically uncovered in pre-silicon verification. Typical post-silicon bugs discovered include those that are manifested after long or at-speed operation of the system, those resulting due to incorrect modeling of hardware and firmware interfaces, those resulting from Register-Transfer Language ("RTL") errors that escaped pre-silicon detection, and those resulting from incorrect mapping of RTL-to-silicon (synthesis/physical bugs). Accepted methods of exercising systems to expose post-silicon bugs include running operating systems and software applications targeted for the final system, creating specific directed software tests that stress different portions of the system, and running software tests that create random system operations.

Real-time observability ("RTO") refers to the ability to monitor and capture internal signals in real time either on- or off-chip. While internal signal observability features have been available in some field programmable gate array ("FPGA") architectures and application specific integrated circuits ("ASICs"), they have typically been of limited scope. Limiting factors have been silicon area, wiring constraints, and I/O limitations. In addition, observability features have traditionally been used for debug and not functional test coverage.

Often in the context of RTO, non-zero relative latencies exist between a pair of functional signals being observed. It may be the case that one or more cycles of delay must be introduced into one of the functional signals, thereby to equalize the relative latencies thereof. Those of ordinary skill in the art will recognize that there are many other reasons that a functional signal may need to be delayed by one or more clock cycles; for example, to change signal timing. Regardless of the reason for introducing a delay, it will be appreciated that it is desirable to be able to introduce a delay of a specified number of clock cycles using as few gates as possible to achieve that purpose.

DETAILED DESCRIPTION OF THE DRAWINGS

Figure 1:
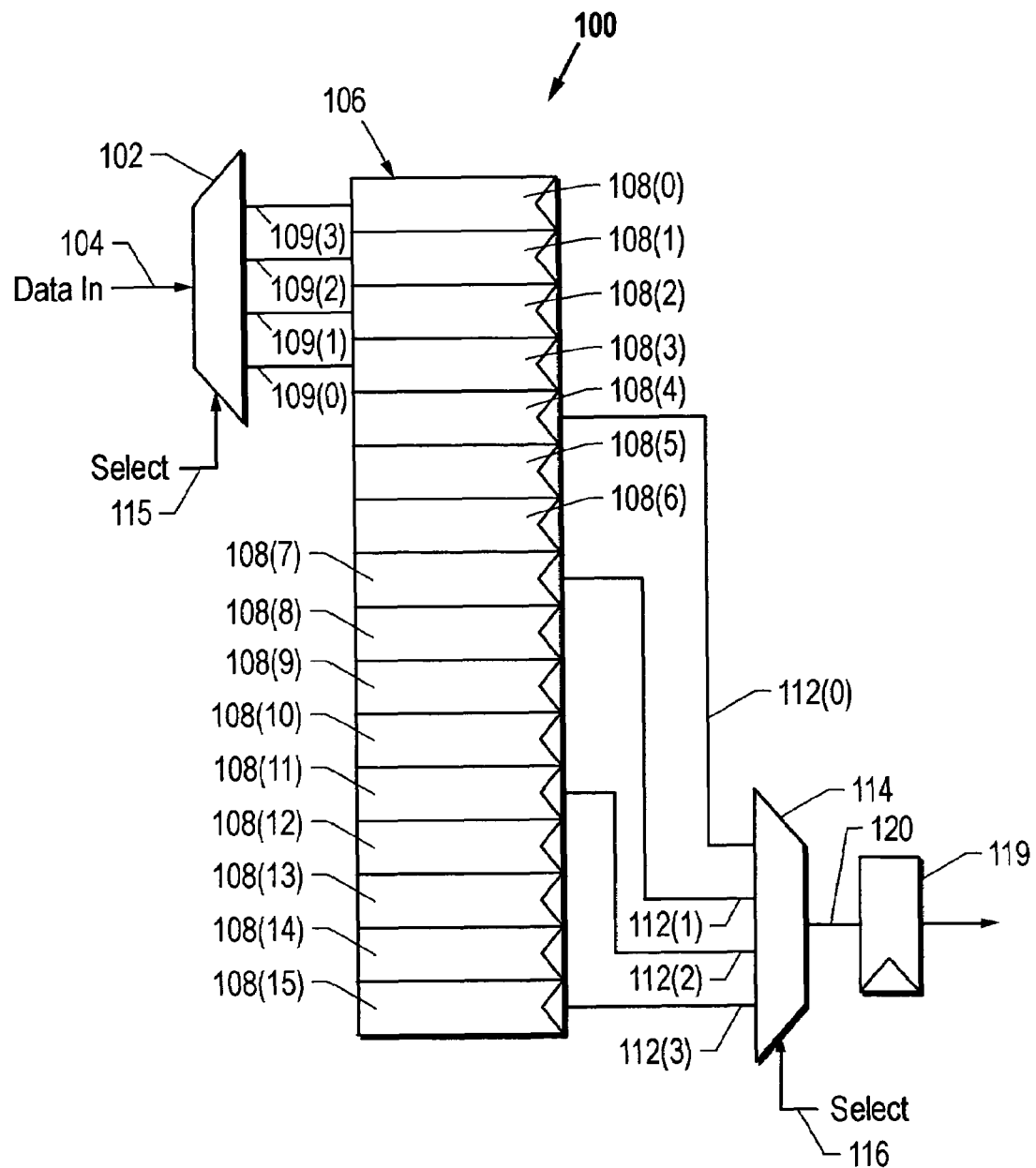
FIG. 1 is a functional block diagram of one embodiment of a general purpose programmable delay logic.

In one embodiment, the present disclosure is directed to circuitry and associated method for delaying a signal input thereto by a number of clock cycles X. In one aspect, a logic circuit comprises a demultiplexer ("DEMUX") which includes an input for receiving the signal and N outputs; a register array comprising at least X registers, wherein each of the N outputs of the DEMUX is connected to a corresponding one of the X registers; and a multiplexer ("MUX") comprising M inputs, wherein each of the M inputs is connected to one of the registers.

In the drawings described in detail hereinbelow, like or similar elements are designated with identical reference numerals throughout the several views thereof, and the various elements depicted are not necessarily drawn to scale.

An embodiment of the invention can be generally characterized as follows. Any delay of $2^N$ clock cycles can be realized using an N-way demultiplexer ("DEMUX") to drive data into a $2^N$ deep register array. The DEMUX outputs are routed to the first N registers in the array. For each register in the array, if data is not driven into that register directly by the DEMUX, data from the previous register is used. Thus, the register array operates in a manner similar to a shift register. To read the signal after the desired delay, the inputs of an N-way multiplexer ("MUX") are driven by each Nth register of the array. By using various values for the select signals of the DEMUX and the MUX, delays from 1 to $2^N$ are realizable. For delay maximums other than $2^N$, the unneeded registers may be omitted from the end of the array and unused MUX inputs tied off.

FIG. 1 is a functional block diagram of an embodiment of a 1-to-$2^N$ delay logic 100, where N is equal to four. Accordingly, the delay logic 100 is capable of introducing into a signal delays of between 1 and 16 clock cycles. The delay logic 100 includes a 4-way DEMUX 102 that drives data input thereto via an input 104 into a register array 106 comprising 16 registers 108(0)-108(15). Each of four outputs 109(0)-109(3) of the DEMUX 102 is connected to one of the first N, in this case, four, registers (registers 108(0)-108(3)) of the array 106 as illustrated in FIG. 1.

Figure 2:
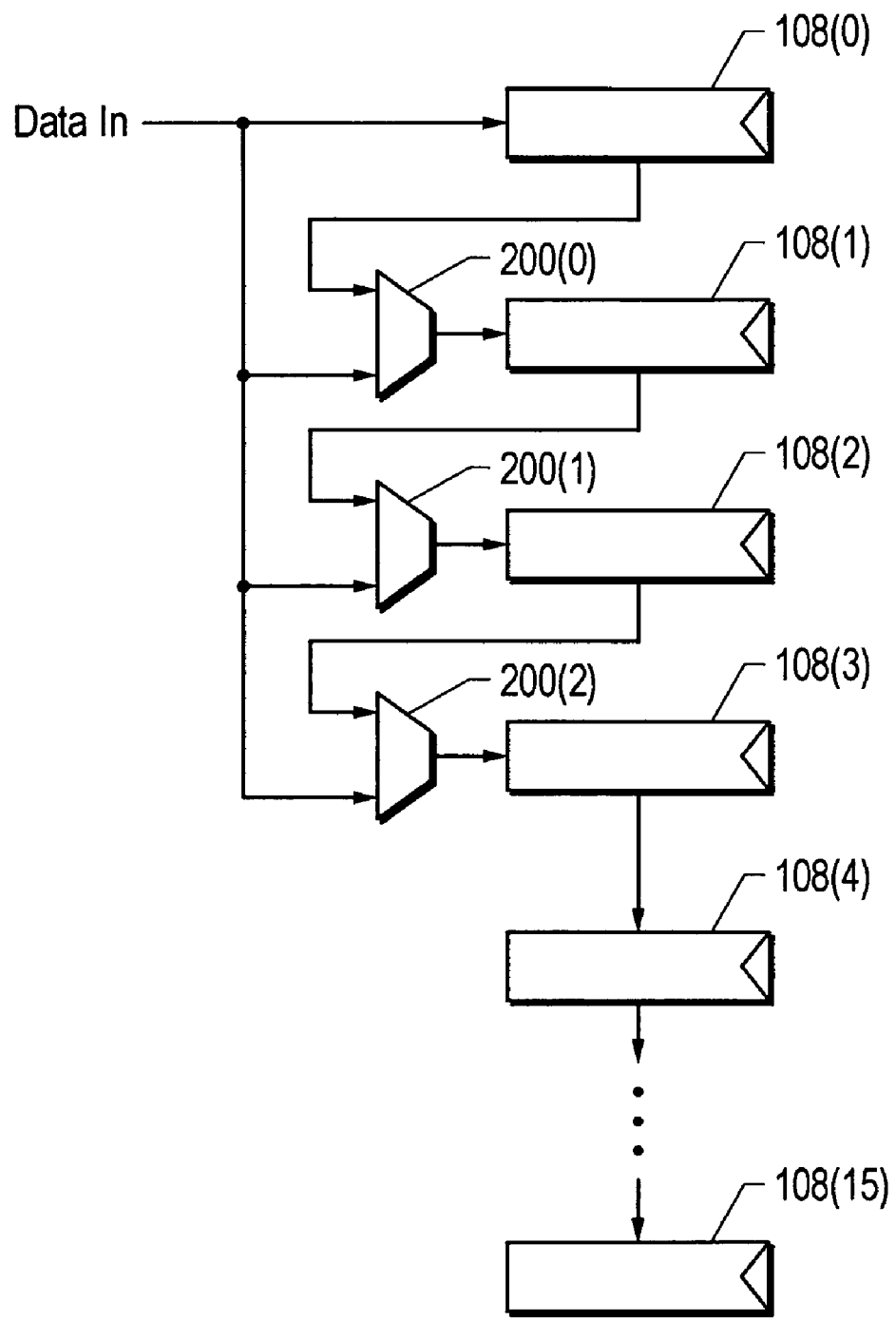
FIG. 2 is a more detailed block diagram of the general purpose programmable delay logic of FIG. 1.

As will be illustrated in greater detail in FIG. 2, for each register 108(0)-108(15) in the array 106, if data is not driven into that register directly from the DEMUX 102, data from the previous register is used. Thus, the register array 106 operates in a manner similar to a shift register.

To read the signal after the desired delay, inputs 112(0)-112(3) of a 4-way MUX 114 are driven by a respective one of each 4th register, i.e., registers 108(3), 108(7), 108(11), and 108(15), of the array 106. By using various values for DEMUX select input 115 and the MUX select input 116, delays from 1 to 16 are realizable with the delay logic 100. The delayed signal is output from the MUX 114, e.g., to a register 119, via an output 120.

For example, to realize a delay of one clock cycle, both the DEMUX 102 and the MUX 114 would be configured to select the register 108(3); that is, the DEMUX output 109(0) and the MUX input 112(0) would be selected via appropriate DEMUX and MUX select signals applied to the DEMUX select input 115 and MUX select input 116, respectively. To realize a delay of two clock cycles, the DEMUX 102 would be configured to select the register 108 (2) and the MUX 114 would be configured to select the register 108(3); that is, the DEMUX output 109(1) and the MUX input 112(0) would be selected via appropriate DEMUX and MUX select signals applied to the DEMUX select input 115 and MUX select input 116, respectively. To realize a delay of three clock cycles, the DEMUX 102 would be configured to select the register 108(1) and the MUX 114 would be configured to select the register 108(3); that is, the DEMUX output 109 (2) and the MUX input 112(0) would be selected via appropriate DEMUX and MUX select signals applied to the DEMUX select input 115 and MUX select input 116, respectively. To realize a delay of four clock cycles, the DEMUX 102 would be configured to select the register 108(0) and the MUX 114 would be configured to select the register 108(3); that is, the DEMUX output 109 (3) and the MUX input 112(0) would be selected via appropriate DEMUX and MUX select signals applied to the DEMUX select input 115 and MUX select input 116, respectively.

To realize a delay of five clock cycles, the DEMUX 102 would be configured to select the register 108(3) and the MUX 114 would be configured to select the register 108 (7); that is, the DEMUX output 109(0) and the MUX input 112(1) would be selected via appropriate DEMUX and MUX select signals applied to the DEMUX select input 115 and MUX select input 116, respectively. To realize a delay of six clock cycles, the DEMUX 102 would be configured to select the register 108(2) and the MUX 114 would be configured to select the register 108(7); that is, the DEMUX output 109(1) and the MUX input 112(1) would be selected via appropriate DEMUX and MUX select signals applied to the DEMUX select input 115 and MUX select input 116, respectively. To realize a delay of seven clock cycles, the DEMUX 102 would be configured to select the register 108(1) and the MUX 114 would be configured to select the register 108(7); that is, the DEMUX output 109(2) and the MUX input 112(1) would be selected via appropriate DEMUX and MUX select signals applied to the DEMUX select input 115 and MUX select input 116, respectively. To realize a delay of eight clock cycles, the DEMUX 102 would be configured to select the register 108(0) and the MUX 114 would be configured to select the register 108(7); that is, the DEMUX output 109(3) and the MUX input 112(1) would be selected via appropriate DEMUX and MUX select signals applied to the DEMUX select input 115 and MUX select input 116, respectively.

To realize a delay of nine clock cycles, the DEMUX 102 would be configured to select the register 108(3) and the MUX 114 would be configured to select the register 108(11); that is, the DEMUX output 109(0) and the MUX input 112(2) would be selected via appropriate DEMUX and MUX select signals applied to the DEMUX select input 115 and MUX select input 116, respectively. To realize a delay of ten clock cycles, the DEMUX 102 would be configured to select the register 108 (2) and the MUX 114 would be configured to select the register 108(11); that is, the DEMUX output 109(1) and the MUX input 112(2) would be selected via appropriate DEMUX and MUX select signals applied to the DEMUX select input 115 and MUX select input 116, respectively. To realize a delay of eleven clock cycles, the DEMUX 102 would be configured to select the register 108(1) and the MUX 114 would be configured to select the register 108(11); that is, the DEMUX output 109(2) and the MUX input 112(2) would be selected via appropriate DEMUX and MUX select signals applied to the DEMUX select input 115 and MUX select input 116, respectively. To realize a delay of twelve clock cycles, the DEMUX 102 would be configured to select the register 108(0) and the MUX 114 would be configured to select the register 108(11); that is, the DEMUX output 109(3) and the MUX input 112(2) would be selected via appropriate DEMUX and MUX select signals applied to the DEMUX select input 115 and MUX select input 116, respectively.

To realize a delay of thirteen clock cycles, the DEMUX 102 would be configured to select the register 108(3) and the MUX 114 would be configured to select the register 108 (15); that is, the DEMUX output 109(0) and the MUX input 112 (3) would be selected via appropriate DEMUX and MUX select signals applied to the DEMUX select input 115 and MUX select input 116, respectively. To realize a delay of fourteen clock cycles, the DEMUX 102 would be configured to select the register 108(2) and the MUX 114 would be configured to select the register 108(15); that is, the DEMUX output 109(1) and the MUX input 112(3) would be selected via appropriate DEMUX and MUX select signals applied to the DEMUX select input 115 and MUX select input 116, respectively. To realize a delay of fifteen clock cycles, the DEMUX 102 would be configured to select the register 108(1) and the MUX 114 would be configured to select the register 108 (15); that is, the DEMUX output 109(2) and the MUX input 112(3) would be selected via appropriate DEMUX and MUX select signals applied to the DEMUX select input 115 and MUX select input 116, respectively. To realize a delay of sixteen clock cycles, the DEMUX 102 would be configured to select the register 108(0) and the MUX 114 would be configured to select the register 108(15); that is, the DEMUX output 109(3) and the MUX input 112(3) would be selected via appropriate DEMUX and MUX select signals applied to the DEMUX select input 115 and MUX select input 116, respectively.

FIG. 2 is a more detailed block diagram of a particular implementation of the delay logic 100. As shown in FIG. 2, the functionality of the DEMUX 102 may be implemented using several 2×1 MUXes 200(0)–200(2) each having an output connected to a respective one of the registers 108(1)-108(3), a first input connected to receive data output from an immediately preceding register (i.e., registers 108(0)-108(2), respectively), and a second output connected to receive data input to the delay logic 100. In operation, if the register 108(0) is selected, each of the MUXes 200(0)-200(2) is configured such that the first input thereof is selected. If the register 108(1) is selected, the MUX 200(0) is configured such that the second input thereof is selected and each of the MUXes 200(1) and 200(2) is configured such that the first input thereof is selected. If the register 108(2) is selected, the MUX 200(1) is configured such that the second input thereof is selected and the MUX 200(2) is configured such that the first input thereof is selected. It does not matter which one of the inputs of the MUX 200(0) is selected. Finally, if the register 108(3) is selected, the MUX 200(2) is configured such that the second input thereof is selected. It does not matter which one of the inputs of the MUXes 200(0) and 200(1) are selected.

Figure 3:
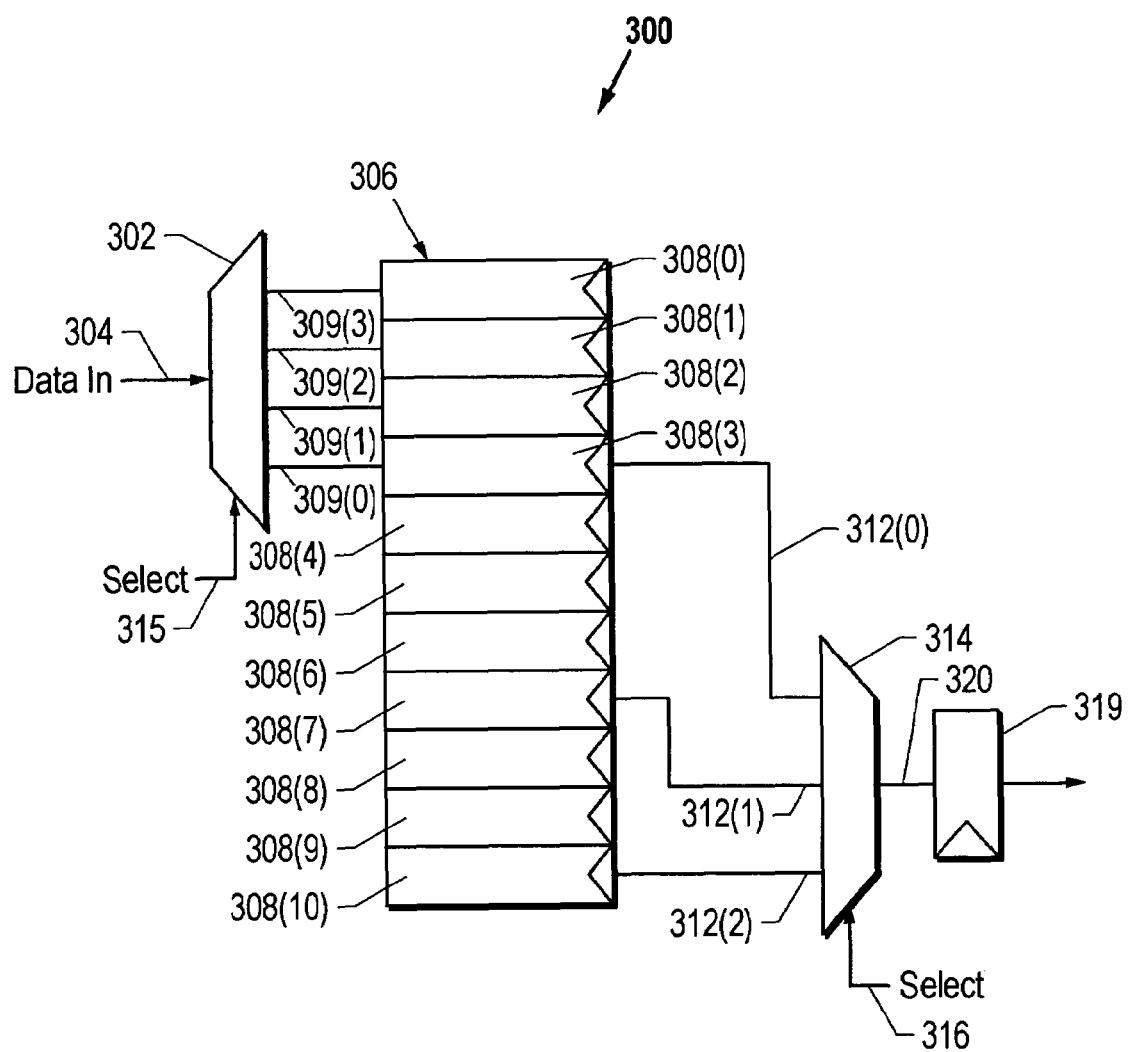
FIG. 3 is a functional block diagram of an alternative embodiment of a general purpose programmable delay logic.

As previously indicated, to realize delay maximums other than $2^N$, the unneeded registers (i.e., those beyond the desired delay maximum up to $2^N$) may be omitted from the end of the array and the unused MUX inputs tied off. FIG. 3 illustrates delay logic 300 for realizing a non-$2^N$ delay maximum of 11.

The delay logic 300 includes a 4-way DEMUX 302 that drives data input thereto via an input 304 into a register array 306 comprising 11 registers 308(0)-308(10). Each of four outputs 309(0)-309(3) of the DEMUX 302 is connected to one of the first N, in this case, four, registers (registers 308(0)-308(3)) of the array 306 as illustrated in FIG. 3.

To read the signal after the desired delay, inputs 312(0) and 312(1) of a MUX 314 are driven by a respective one of each 4th register, i.e., registers 308(3) and 308(7), of the array 306. Input 312(2) of the MUX 314 is driven by the last register of the array 306, i.e., the register 308(10). A fourth input of the MUX 314 is tied off and not illustrated in FIG. 3. By using various values for DEMUX select input 315 and the MUX select input 316, delays from 1 to 11 are realizable with the delay logic 300. The delayed signal is output from the MUX 314, e.g., to a register 319, via an output 320.

Figure 4:
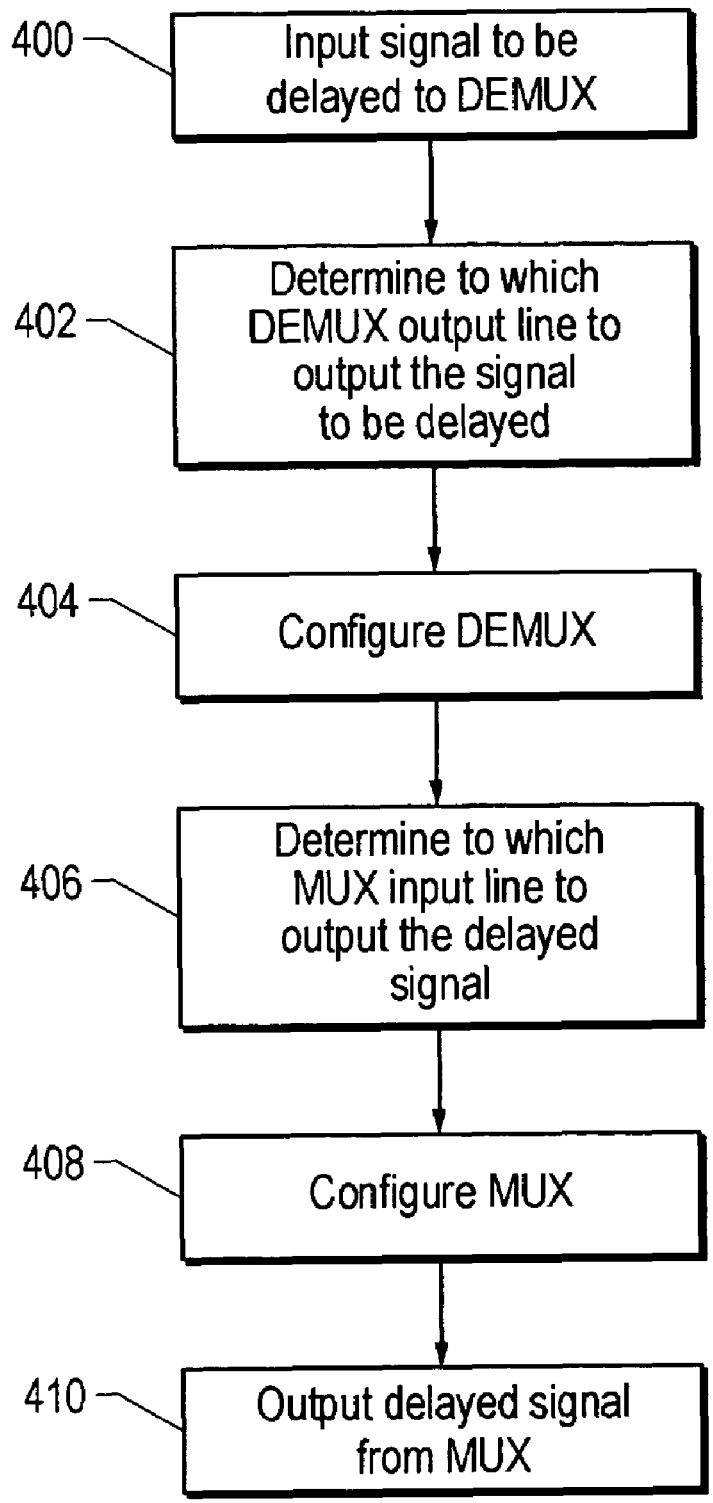
FIG. 4 is a flowchart of the operation of the general purpose programmable delay logic of FIG. 1.

FIG. 4 is a flowchart of the operation of the delay logic 100 of FIG. 1. In step 400, a signal to be delayed by a specified number of clock cycles X is input to the DEMUX 102. In step 402, a determination is made as to which output line 109(0)-109(3) on which the signal should be output from the DEMUX 102 (that is, to which register 108(0)-108(3) of the array 106 the signal should be input) based on the desired delay. In particular, assuming, as is the case with the delay logic 100, that the highest order DEMUX output (i.e., the output 109(3)) is connected to the first register of the array (i.e., the register 108(0)) and that the lowest order DEMUX output (i.e., the output 109(0)) is connected to the Nth register of the array (i.e., the register 108(3)), the selected output of the DEMUX 102 is identified by 109 (R), where R is the remainder of the equation (X+3)/4. For example, for a one clock cycle delay, the remainder of (1+3)/4 is 0; therefore, the output is identified by 109(0). Similarly, for an eight clock cycle delay, the remainder of (8+3)/4 is 3; therefore, the output is identified by 109(3). In step 404, the DEMUX 102 is configured as determined in step 402 by applying appropriate select signals to the DEMUX select input 115.

In step 406 a determination is made as to which input line 112(0)-112(3) on which the signal should be input to the MUX 114 (that is, from which register 108(3), 108(7), 108(11), and 108(15) of the array 106 the signal should be output) based on the desired delay. In particular, assuming, as is the case with the delay logic 100, that the lowest order MUX input (i.e., the input 112(0)) is connected to the Nth register of the array 106 (i.e., the register 108(3)), that the highest order MUX input (i.e., the input 112(3)) is connected to the last register of the array (i.e., the register 108(15)), the selected input of the MUX 114 is identified by 112(A), such that:

$$A \cdot N < X \leq (A+1) \cdot N$$

For example, for a one clock cycle delay, A must be equal to 0; therefore, the input is identified by 112(0). Similarly, for a twelve clock cycle delay, A must be equal to 2; therefore, the input is identified by 112(2). In step 408, the MUX 114 is configured as determined in step 406 by applying appropriate select signals to the MUX select input 116. In step 410, the delayed signal is output from the MUX 114.

An implementation of the invention described herein thus provides an architecture topology for enabling real-time observability in an IC. The embodiments shown and described have been characterized as being illustrative only; it should therefore be readily understood that various changes and modifications could be made therein without departing from the scope of the present invention as set forth in the following claims. For example, while particular logic circuits, gates, and elements are illustrated as being used to implement the embodiments shown herein, it will be appreciated that other equivalent logic circuits and elements may be used.

Accordingly, all such modifications, extensions, variations, amendments, additions, deletions, combinations, and the like are deemed to be within the ambit of the present invention whose scope is defined solely by the claims set forth hereinbelow.

What is claimed is:

1. A logic circuit for delaying a signal input thereto by a specified number of clock cycles X, the logic circuit comprising;
   a demultiplexer ("DEMUX") comprising an input for receiving the signal and N outputs;
   a register array with a plurality of registers connected to pass a signal therethrough, each of the N outputs of the DEMUX being connected to a corresponding one of the registers of the register array; and
   a multiplexer ("MUX") comprising M inputs, each of the M inputs being connected to one of the registers of the register array.

2. The logic circuit of claim 1 wherein the MUX includes a select input and wherein a signal input to the select input selects one of the M inputs of the MUX.

3. The logic circuit of claim 1 wherein a highest order DEMUX output is connected to a first register of the register array and a lowest order DEMUX output is connected to an Nth register of the register array.

4. The logic circuit of claim 1 wherein a select signal for the DEMUX is determined based on the specified number of clock cycles X.

5. The logic circuit of claim 1 wherein the registers of the register array comprise clocked registers.

6. The logic circuit of claim 1 wherein each of the registers of the register array is clocked by a different clock.

7. The logic circuit of claim 1 wherein every Nth register of the register array is connected to one of the M inputs of the MUX.

8. A circuit for delaying a signal by a specified number of clock cycles X, the circuit comprising:
   means for inputting a signal to a first selected register of a register array;
   means for shifting the signal from the first selected register to a next one of the register array on each clock cycle until the signal reaches a second selected register of the register array; and
   means for outputting the signal from the second selected register subsequent to the shifting.

9. The circuit of claim 8 wherein the means for inputting comprises a demultiplexer ("DEMUX") having one input for receiving the signal and N outputs, wherein each of the N outputs of the DEMUX is connected to a corresponding one of the registers of the register array.

10. The circuit of claim 9 wherein the DEMUX comprises a select input for receiving a select signal to select one of the N outputs of the DEMUX.

11. The circuit of claim 9 wherein a highest order DEMUX output is connected to a first register of the register array and a lowest order DEMUX output is connected to an Nth register of the register array.

12. The circuit of claim 9 wherein the first selected register and the second selected register are determined based on the specified number of clock cycles X.

13. A method of delaying a signal by a specified number of clock cycles X, the method comprising:
   inputting a signal to a first selected register of a register array;
   on each clock cycle, shifting the signal from the first selected register to a next one of the register array until the signal reaches a second selected register of the register array; and
   subsequent to the shifting, outputting the signal from the second selected register.

14. The method of claim 13 wherein the inputting comprises inputting the signal to an input of a demultiplexer ("DEMUX") and outputting the signal via a selected one of N outputs of the DEMUX, wherein each of the N outputs of the DEMUX is connected to one of the registers of the register array.

15. The method of claim 14 further comprising inputting a select signal to the DEMUX to select one of the N outputs of the DEMUX, wherein the select signal is based on the specified number of clock cycles X.

16. The method of claim 13 further comprising clocking the registers of the register array with a clock signal having the same frequency.

17. The method of claim 13 further comprising clocking the registers of the register array with different clock signals.

18. The method of claim 13 further comprising configuring a multiplexer ("MUX") having M inputs, wherein each of the M inputs is operable to be connected to one of the registers of the register array, the MUX operating to select one of the M inputs as the output signal with delay.

* * * * *

UNITED STATES PATENT AND TRADEMARK OFFICE
CERTIFICATE OF CORRECTION

PATENT NO. : 7,365,574 B2
APPLICATION NO. : 11/207635
DATED : April 29, 2008
INVENTOR(S) : Tyler James Johnson It is certified that error appears in the above-identified patent and that said Letters Patent is hereby corrected as shown below:

In column 6, lines 47-48, in Claim 1, after "comprising" delete ";" and insert -- : --, therefor.

Signed and Sealed this

Twelfth Day of August, 2008

JON W. DUDAS
*Director of the United States Patent and Trademark Office*